(12) United States Patent
Tan et al.

(10) Patent No.: US 8,477,049 B2
(45) Date of Patent: Jul. 2, 2013

(54) EFFICIENTLY EMBEDDING INFORMATION ONTO A KEYBOARD MEMBRANE

(75) Inventors: Li-Quan Tan, Sunnyvale, CA (US); Harold J. Welch, San Jose, CA (US); Wing Kong Low, Sunnyvale, CA (US); Chad Bronstein, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 972 days.

(21) Appl. No.: 12/479,631

(22) Filed: Jun. 5, 2009

(65) Prior Publication Data

US 2010/0309029 A1 Dec. 9, 2010

(51) Int. Cl.
*H03K 17/94* (2006.01)

(52) U.S. Cl.
USPC .................. 341/26; 341/20; 341/22; 345/168; 710/67

(58) Field of Classification Search
USPC ..................... 341/20, 22, 26; 345/168; 710/67
See application file for complete search history.

(56) References Cited

U.S. PATENT DOCUMENTS

| 5,333,273 | A | | 7/1994 | Raasch et al. |
| 5,623,261 | A | | 4/1997 | Rose |
| 5,659,308 | A | | 8/1997 | Goff |
| 5,856,795 | A | * | 1/1999 | Arnold et al. .................. 341/26 |
| 5,973,675 | A | * | 10/1999 | Joto et al. ....................... 345/168 |
| 6,615,287 | B1 | * | 9/2003 | Behrens et al. ................... 710/8 |
| 6,993,608 | B2 | | 1/2006 | Rothman et al. |
| 2005/0102432 | A1 | | 5/2005 | Winslow |
| 2008/0316067 | A1 | * | 12/2008 | Siepmann ....................... 341/26 |

* cited by examiner

*Primary Examiner* — Jennifer Mehmood
*Assistant Examiner* — Andrew Bee
(74) *Attorney, Agent, or Firm* — Dorsey & Whitney LLP

(57) ABSTRACT

Methods and systems for efficiently embedding information in a keyboard membrane. Information can be embedded in the keyboard membrane by integrating an information embedding circuit with a switch matrix used to identify location of a key press event. The information is embedded by either hardwiring a column to a selected row, or a row to a selected column. In order to access the embedded information, the row (column) is asserted resulting in the hardwired column (row) to also be asserted. The identification of the asserted column (row) is used to point to the embedded information.

20 Claims, 9 Drawing Sheets

EFFICIENTLY EMBEDDING INFORMATION ONTO A KEYBOARD MEMBRANE

BACKGROUND OF THE INVENTION

1. Field of the Invention

This invention relates generally to computer peripheral devices. More specifically, techniques for efficiently embedding information in a user input device, such as a keyboard membrane, are described.

2. Description of the Related Art

FIG. 1 is shows a conventional keyboard 100 having keyboard membrane 102. Keyboard membrane 102 has a layered structure including a lower resin sheet 104 and an upper resin sheet 106. Column contact pad(s) $X_0$-$X_4$ and a lower wiring pattern(s) 108 are formed on an upper surface of the lower resin sheet 104. Furthermore, row contact pad(s) $Y_0$-$Y_4$ and an upper wiring pattern(s) 110 are formed on a lower surface of the upper resin sheet 106. Taken together upper wiring pattern 110 and lower wiring pattern 108 form keyboard scanning matrix 112 having key 114 located at most of the row/column intersections. In this way, a user pressing a key (referred to as key press 116) will short together the respective row and column of scanning matrix 112. In order to identify the character appropriate to the key being pressed, the relevant key location vis a vis scanning matrix 112 must be quickly and accurately determined. Therefore, in order to identify the location of the key being pressed, each of column contact pads $X_0$-$X_4$ is sequentially asserted (i.e., by applying a voltage corresponding to either a HIGH or LOW value) for a period of time (column assertion period). During the period of time that a particular column conductor is asserted, each of the row contact pad $Y_0$-$Y_4$ are sensed (during a row sensing cycle). Since pressing a key results in shorting a single row to a single column (at least during the period of time that a user has maintained key press 116), the contact pad associated with the row on which the key being pressed is located will also be asserted (i.e., either HIGH or LOW) for a period of time at least as long as the period of time that the column associated with the key being pressed is asserted. Therefore, the single row contact pad that is determined to be asserted during the row scanning operation is used with the identification of the asserted column to provide the co-ordinates in scanning matrix 112 corresponding to key press 116.

Once the location of the key press 116 is determined, that information is passed to keyboard processor 118 by way of contacts 120 in tail 122. Keyboard processor 118 uses the location information to read a character map 124 that maps a key pad location with a character. However, many of today's keyboards are capable of multiple configurations where different keys can map to different characters. For example, keyboard 100 can be configured to act as an ANSI type keyboard, a JIS type keyboard, or a ISO type keyboard. Therefore, during boot up, keyboard processor 118 must detect the type of keyboard being used, communicate this information to the system so that the system can apply the appropriate conversion to the keycodes subsequently sent by the keyboard providing the correct correspondence between key location and character.

Information such as language type, special configuration and other important information (such as keyboard type) can be embedded on keyboard membrane 102 using discrete information embedding circuit126. Unfortunately, however, the information provided by information embedding circuit126 is typically used only once at the initialization of keyboard 100 to identify the type of keyboard being used and therefore the version of character map. Once that task has been accomplished, information embedding circuit126 remains unused thereafter. Therefore since information embedding circuit126 is used only once and only for the information contained therein, it especially important that the amount of membrane real estate and the number of contacts used to implement information embedding circuit126 be optimized for the amount of potential information provided.

Therefore, an efficient method, apparatus, and system for embedding information in a keyboard membrane is desirable.

SUMMARY OF THE DESCRIBED EMBODIMENTS

The invention relates to computer peripheral devices. In particular, circuits, systems, and method for embedding information in a keyboard membrane that optimizes the number of contacts, membrane real estate, and amount of information provided therewith.

A system for embedding information in a keyboard membrane incorporated in a keyboard assembly is described. The system includes at least the following, a switch matrix having a plurality of column conductors overlaid with a plurality of row conductors and an information embedding circuit integrated with the switch matrix. The information is embedded in the keyboard membrane by permanently connecting a selected one of the plurality of row conductors with the information embedding column conductor.

A system for embedding information in a keyboard membrane incorporated in a keyboard assembly is also described. The system includes at least a switch matrix having a plurality of column conductors overlaid with a plurality of row conductors. The system also includes at least an information embedding circuit integrated with the switch matrix. The embedded information is embedded in the keyboard membrane by permanently connecting a selected one of the plurality of column conductors with the information embedding row conductor.

A method for embedding information in a keyboard membrane incorporated in a keyboard assembly is described. In the described embodiments, the keyboard membrane includes at least a switch matrix having at least a plurality of column conductors overlaid with a plurality of row conductors and an information embedding circuit integrated with the switch matrix. The method can be carried out by performing at least the following operations. When the information embedding circuit includes an information embedding column line, then connecting a selected one of the plurality of row conductors with the information embedding column line, otherwise when the information embedding circuit includes an information embedding row line, then permanently connecting a selected one of the plurality of column conductors with the information embedding row line.

A keyboard membrane is disclosed. The keyboard membrane including at least a switch matrix and a non-binary type keyboard information embedding circuit integrated with the switch matrix for embedding information in the keyboard.

An apparatus for efficiently embedding information on a keyboard membrane is disclosed. The keyboard membrane having at least a switch matrix formed of x columns and y rows such that the switch matrix includes a number N contact pads, where N=x×y. The apparatus not being part of the switch matrix, the apparatus having at least a single contact pad and a single conductor electrically connected to the single contact pad. The apparatus embeds information in the keyboard membrane when the single conductor is electrically connected to at least of one of the m rows or at least one of the n columns of the switch matrix such that when the single contact pad is asserted, then the contact pad associated with at least the one of the m row or with the at least one n columns is determined to also be asserted. In one aspect of the described embodiment, the apparatus includes a data capture circuit for capturing which of the at least one m rows or at least n columns is asserted.

In another embodiment, a computer readable medium including at least computer program code for accessing information embedded in a keyboard membrane during a keyboard initialization is described. The information can be accessed using an information embedding circuit having at least a cross connected first and second conductor lines. The computer readable medium includes at least computer program code for asserting a contact pad associated with the first conductor line, computer program code for determining an identity of the second conductor line cross connected with the asserted first conductor line, computer program code using the identity of the cross connected second conductor line to access the embedded information, and computer program code for disabling access to the embedded information after the keyboard initialization is successfully completed.

DETAILED DESCRIPTION OF SELECTED EMBODIMENTS

Reference will now be made in detail to selected embodiments an example of which is illustrated in the accompanying drawings. While the invention will be described in conjunction with a preferred embodiment, it will be understood that it is not intended to limit the invention to one preferred embodiment. To the contrary, it is intended to cover alternatives, modifications, and equivalents as can be included within the spirit and scope of the invention as defined by the appended claims.

The described embodiments relate to a cost effective system, method and apparatus suitable for embedding information in a keyboard membrane that optimizes the potential amount of information embedded and the required number of contact pins and membrane real estate.

Figure 2:
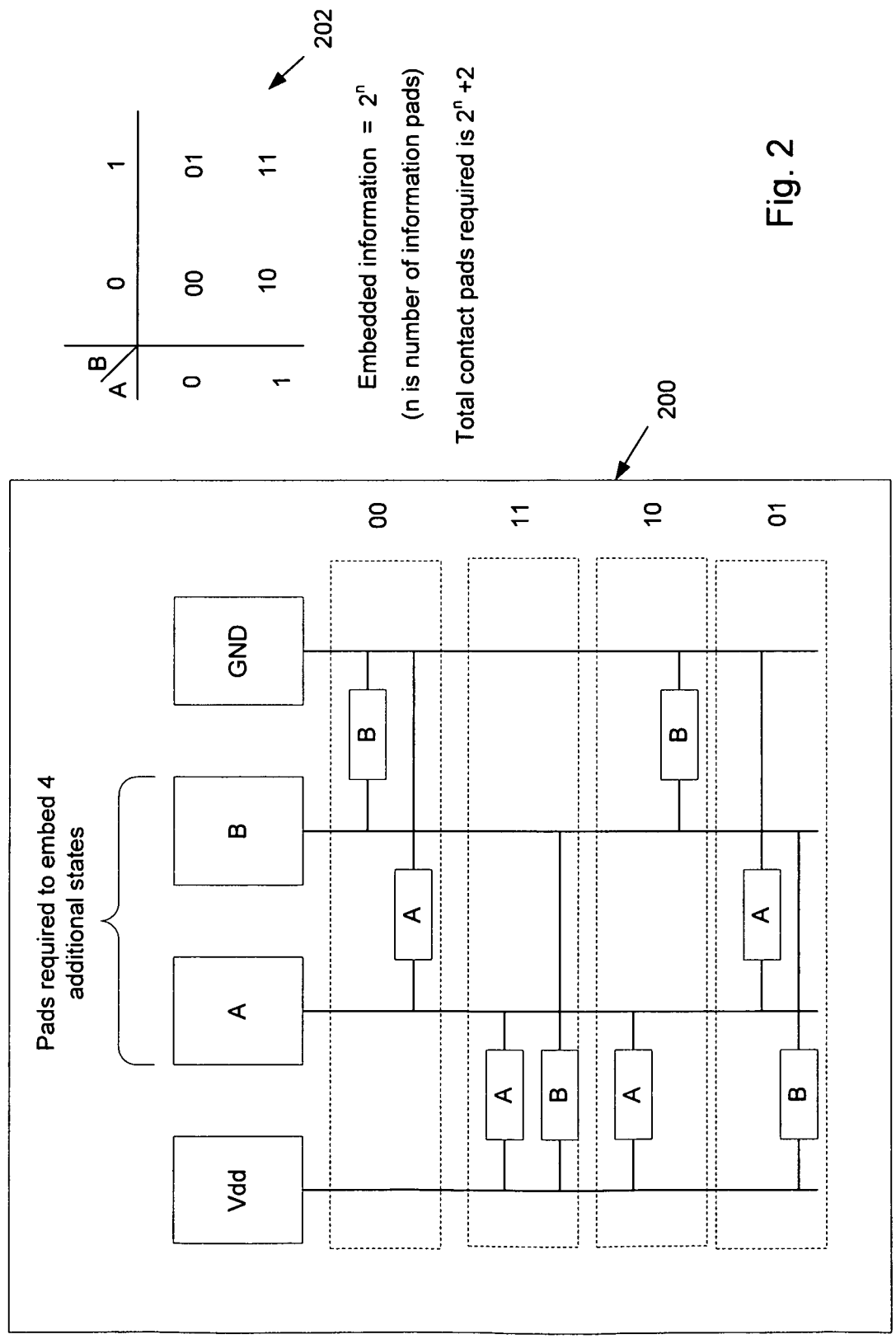
FIG. 2 shows binary embedding circuit capable of embedding at most four additional information states using at least two contact (information) pins in a keyboard membrane.

FIG. 2 shows binary embedding circuit 200 capable of embedding at most four information states (such as, for example, up to four keyboard types) using at least two contact (information) pins and at least one pin for power and one pin for ground for a total of four pins. For example, binary embedding circuit 200 includes at least four pins, pin $V_{dd}$ that can be used to provide power, pin GND connected to a ground plane, and information pins A and B each having an associated trace.

Using binary embedding circuit 200, up to at most four information states (shown in logic table 202) can be embedded in an associated keyboard membrane. Such information states can be used to, for example, identify the type of keyboard (ANSI, JIS, ISO) being used or any other information deemed appropriate. In order to embed such information, one logic state is selected using option connectors referred to as jumper A and jumper B. As shown, the four logic states represented by logic table 202 can be embedded using binary embedding circuit 200 by variously placing jumper A and jumper B to connect information pin A and information pin B, respectively, to some combination of either $V_{dd}$ and GND. For example, in order to embed logic state [00], jumper A connects information pin A to GND and jumper B connects information pin B to GND. On the other hand, in order to embed logic state [10], jumper A connects information pin A to $V_{dd}$ and jumper B connects information pin B to GND. In this way, any of the four logic states [00], [01], [11], and [10] can be embedded using information pins A and B appropriately connected by way of jumper A and jumper B to $V_{dd}$ and/or GND. Although the option connections are described herein as jumpers, typically they are not discrete components but are connections screened onto membrane 102 along with the other circuits contained thereon. Any extra cost is associated with requiring a larger tail (with more contacts) as well as the need for a larger circuit board for the connector to be soldered. Again, it should be remembered that binary embedding circuit 200 will only be used during keyboard boot up and disabled thereafter making this additional complexity and cost even more irksome.

However, no matter how constructed, using binary logic to embed information is not very efficient in terms of the number of contacts used, the amount of membrane real estate required, and the amount of information potentially embedded. As a matter of fact, using binary embedding circuit 200, the number of available information states (s) is related to the number of information contact pads (n) as Eq(1):

$$s=2^n \qquad \text{Eq (1).}$$

In other words, four additional information states requires at least two additional contact pads in order to encode the desired logic and at least two more contact pads, one or power and one for ground.

For example, using binary embedding circuit 200, embedding four information states (s=4) onto keyboard membrane requires at least four contact pads (two for information pads A,B and one for ground GND and one for power supply $V_{DD}$). However, adding a single additional information state for a total of five (s=5) requires the addition of an additional contact pad ((i.e., n=3) over and above those already in use raising the total number of additional contact pads (and their associated traces and contacts) to at least five. Moreover, adding to this relative inefficient use of contact pads and associated traces/contacts is the fact that binary embedding circuit 200 is used only during keyboard initialization. Accordingly, a more efficient method, system and apparatus for embedding information in a keyboard membrane is described herein with regards to the following description and figures.

Figure 3A:
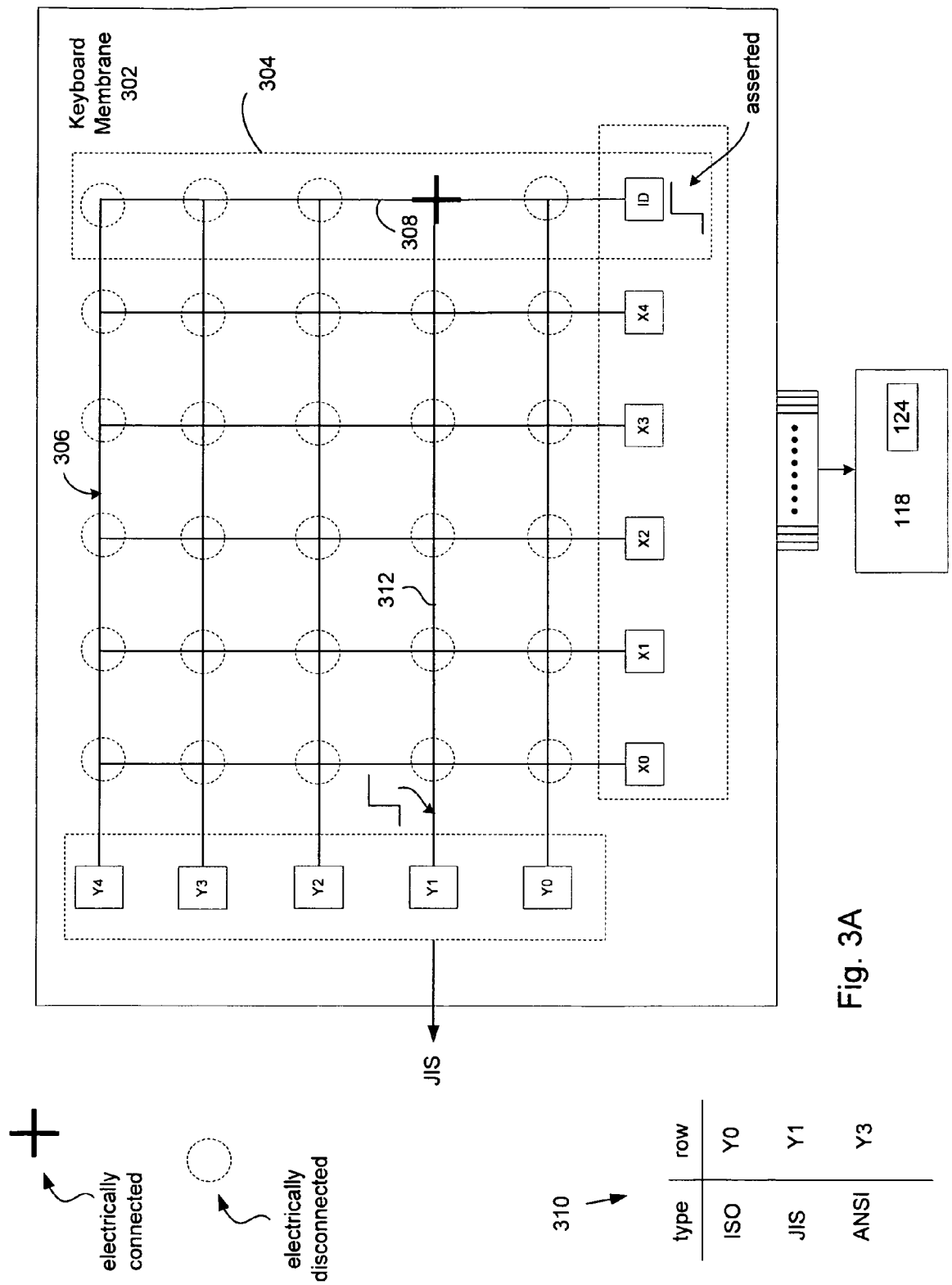
FIGS. 3A-3D shows various information embedding circuits in accordance with the embodiments described herein.

FIG. 3A shows keyboard 300 having keyboard membrane 302 in accordance with the embodiments described herein. It should be noted that keyboard membrane 302 represents a version of a standard keyboard membrane simplified by reducing the number of rows and columns so as to not obscure the fundamental principles of the described embodiment. For example, a typical keyboard membrane can have eight (8) columns and thirteen (13) rows (and vice versa) with approximately one hundred (100) or so active keys. Accordingly, it is contemplated that any discussion herein pertaining to specific numbers of rows, column, keys, etc. can be scaled up to any appropriate size or type of keyboard or keyboard membrane. It should also be noted that due to the symmetry inherent in the construction and design of keyboard membrane 302, rows and columns can be considered to be interchangeable and still be considered within the scope and intent of the described embodiments.

Unlike conventionally configured keyboard membranes, keyboard membrane 302 does not include a discrete information embedding circuit as described above but rather has column based information embedding circuit 304 integrated with scanning matrix 306. This integration can be accomplished by, for example, adding an additional column 308 and column contact pad ID. In order to embed information into keyboard membrane 302 using information embedding circuit 304, a selected row corresponding to the information desired to be embedded is electrically connected (by for example, hard wiring) to column 308. By asserting column contact pad ID, the corresponding row contact pad will also be asserted. In this way, during a row scanning operation, the identification of which of the row contact pads is an asserted row contact pad, or pads, can be used to access information embedded in keyboard membrane 302. For example (referring to keyboard type table 310 as the embedded information indicating keyboard type) if keyboard 300 is a JIS type keyboard, hardwiring row 312 to column 308 electrically connects contact pad ID to row contact pad $Y_1$. Therefore, during keyboard initialization (or boot up), the asserting of column ID (either HIGH or LOW) results in row contact pad $Y_1$ also being asserted (either HIGH or LOW).

When it is determined that a particular row contact pad has been asserted, this information can be forwarded to keyboard processor 118 for evaluation. In this case, this evaluation can involve keyboard processor 118 querying table 310 and based upon the results of the query, certifying that keyboard 300 is a JIS type keyboard. Once keyboard processor 118 has certified the keyboard type, then keyboard processor 118 can communicate the keyboard type to the system so the system can correctly interpret key presses. The information embedding circuit 304 can be disabled such that it can no longer be accessed or otherwise interfere with the normal operation of keyboard 300. This disabling can be accomplished in many ways, not the least of which can include, for example, forcing contact pad ID to float (i.e., no electrical connection) thereby eliminating the possibility of the assertion of a signal on column 308. Therefore, by the addition of a single contact pad (column pad ID) and associated column 308 up to 5 additional information states (corresponding to the 5 row contact pads) can be embedded in keyboard membrane 302. Compare this to the situation where binary embedding circuit 200 can provide at most 4 additional states using four additional contact pads (pad A and pad B, $V_{dd}$, GND).

Figure 3B:
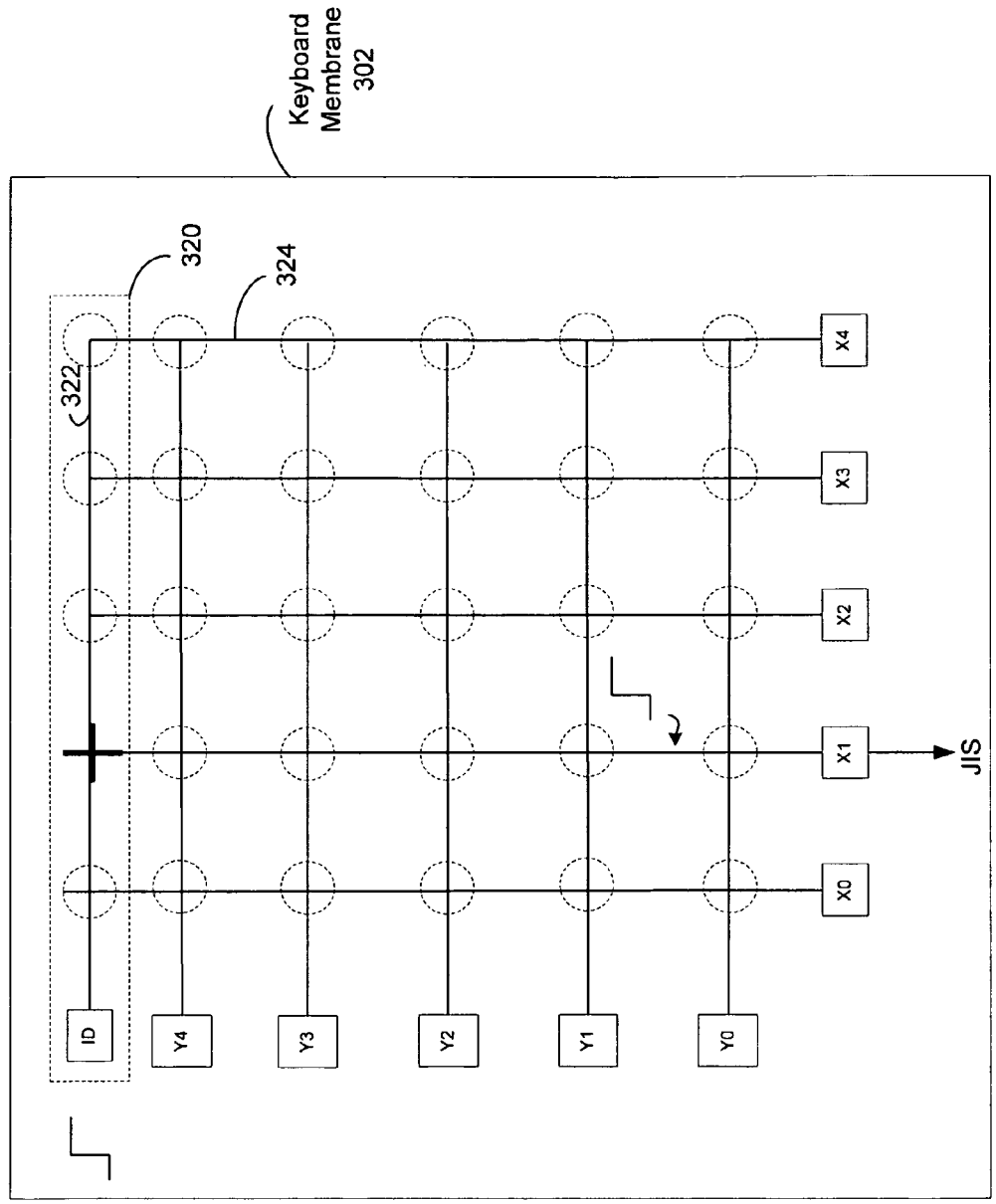

FIG. 3B shows row based information embedding circuit 320 that relies upon the addition of row 322 electrically connected to column 324 to embed the appropriate information in keyboard membrane 302. In this case, the number of information states s is related to the number of columns c used to embed information as in eq. (2)

$$s = c \qquad \text{Eq (2)}$$

where c=number of columns available to be connected to row 322. Using FIG. 3B as the example, up to 5 additional information states can be embedded in keyboard membrane 302 with the additional of a single additional contact pad.

Figure 3C:
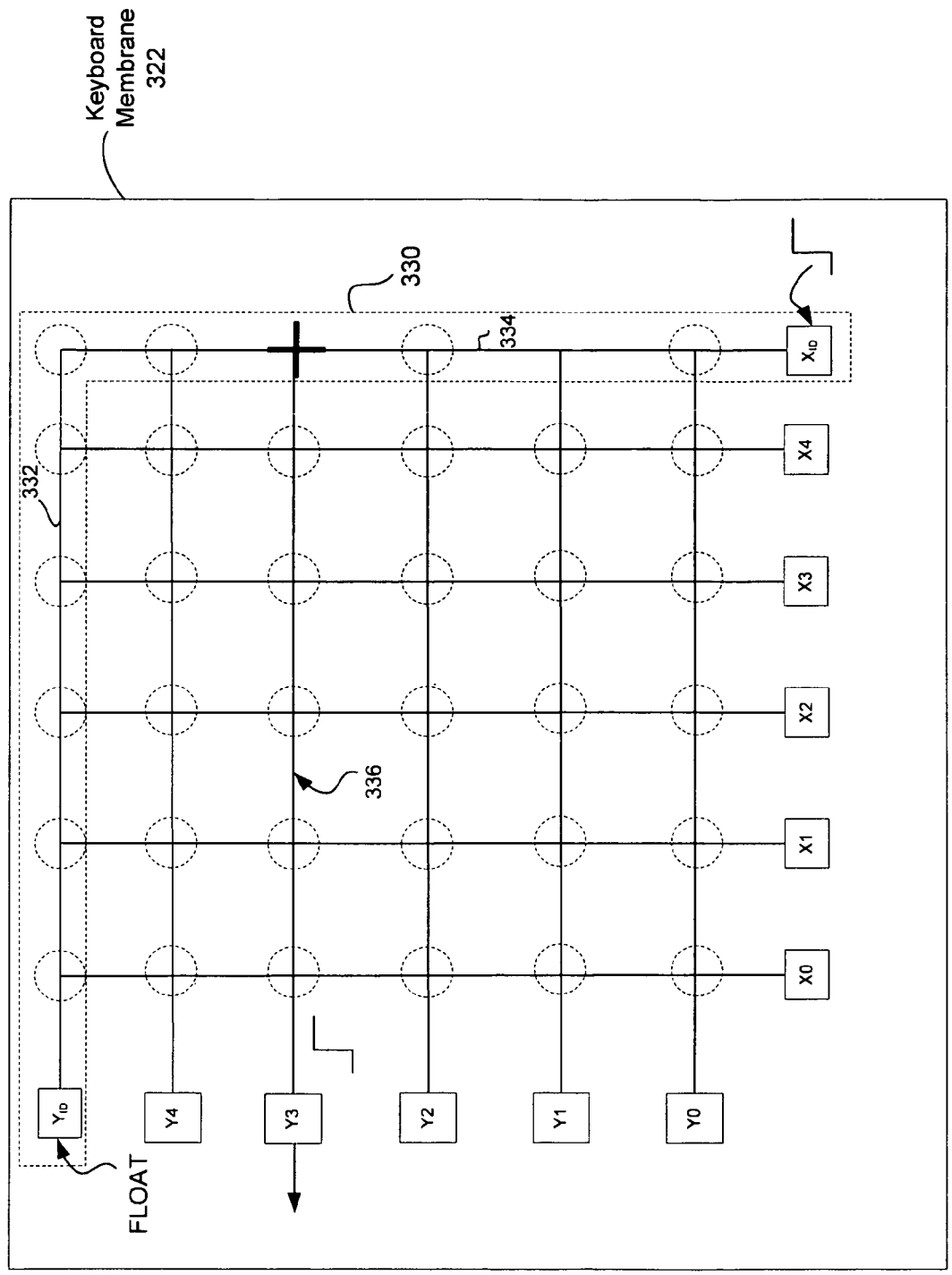

Moreover, FIG. 3C illustrates yet another embodiment whereby information embedding circuit 330 where either row 332 or column 334 can be used to embed information in keyboard membrane 302. For example, if row 332 was used to embed information, then column 334 would be electrically disabled by for example, forcing contact pad $Y_{ID}$ to float. On the other hand, if column 334 was to be used to embed information, then row 332 would be electrically disabled by, for example, forcing contact pad $X_{ID}$ to float. For example, if $Y_{ID}$ is forced to float, electrically connecting column 334 to row 336 can cause pad $Y_3$ to also be asserted (by going either HIGH or LOW) when pad $X_{ID}$ is asserted. Of course, due to the symmetry of information embedding circuit 330, either row 332 or column 334 can be used to embed information in keyboard membrane 302.

Figure 3D:
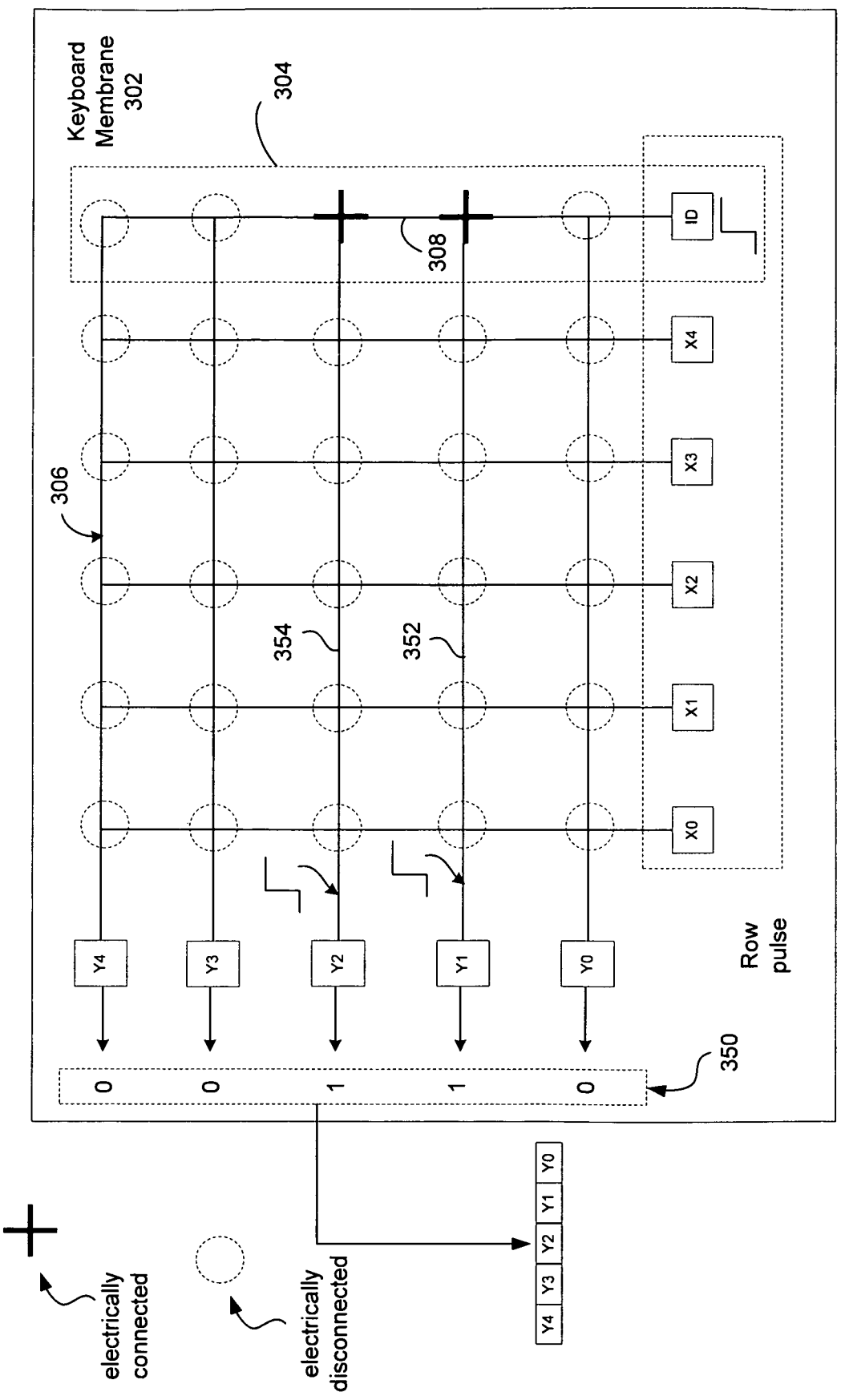

FIG. 3D shows an embodiment of keyboard membrane 302 that provides for concurrent multiple connections between a row and a column. It should be noted, however, that the embodiment shown in FIG. 3D can only be employed if the switch matrix design isolates the contact pads and thereby avoiding problems such as phantom key blocking. In this way, the number of information states s that can be embedded into keyboard membrane 302 can be related to the number of rows or columns as in Eq(3)

$$s = 2^r, \text{ or } s = 2^c \qquad \text{Eq (3)}$$

where r is the number or rows in a row type information embedding circuit as shown in FIG. 3B and c is the number of columns in a column type information embedding circuit as shown in FIG. 3A. For example, in the case shown in FIG. 3D, (assuming that the number of rows n=5), information embedding circuit 304 in combination with data capture circuit 350 can embed up to thirty two ($2^5$) information states. In the example shown in FIG. 3D, data word [0 0 1 1 0] can be embedded in keyboard membrane 302 by electrically connecting column 308 to rows 352 and 354. In this way, when column ID pad is asserted (either HIGH or LOW), then data capture circuit 350 will sense row contact pad $Y_1$ and row contact pad $Y_2$ also being asserted.

Figure 1:
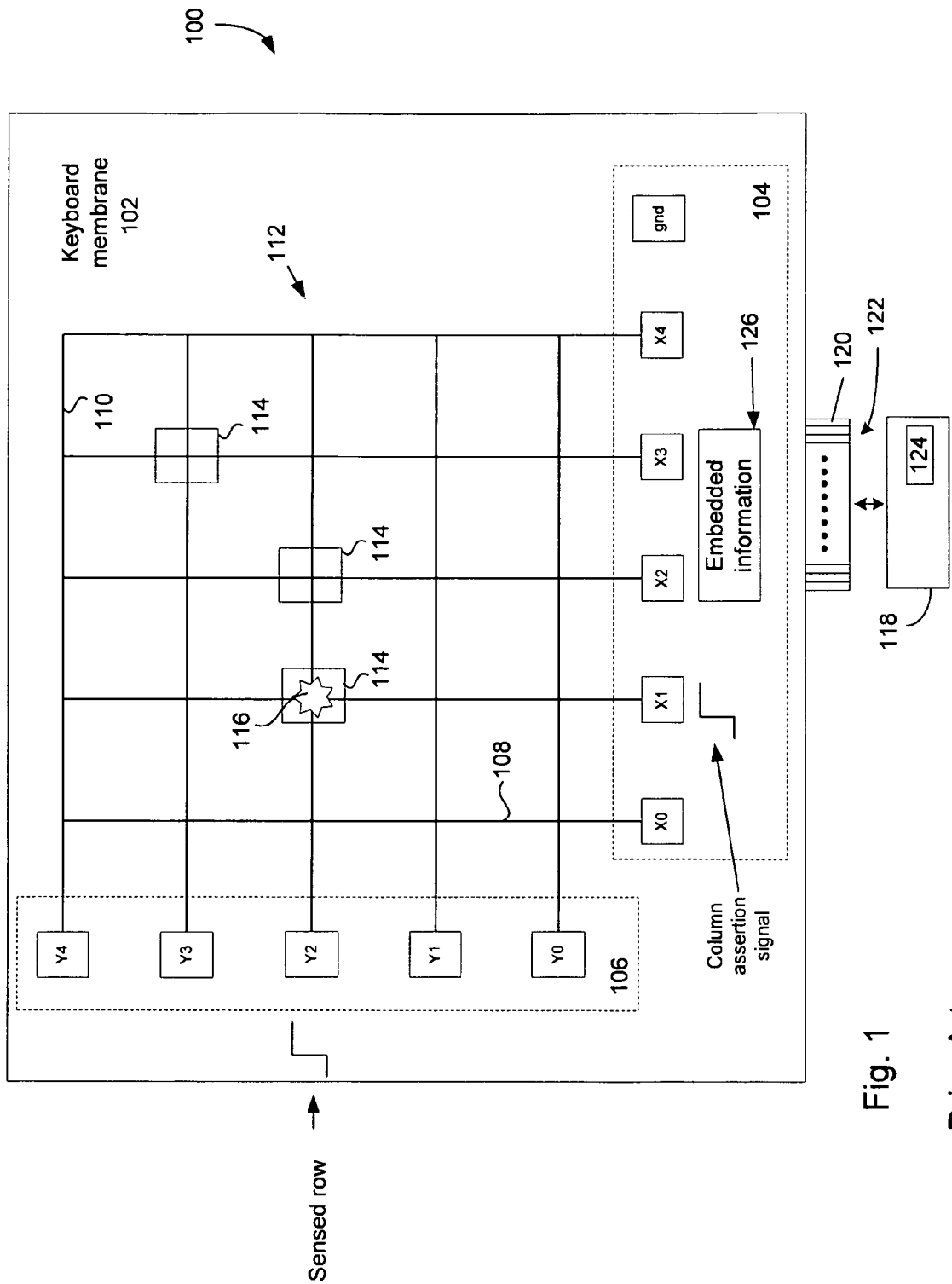
FIG. 1 is shows a conventional keyboard and keyboard membrane.
Figure 4:
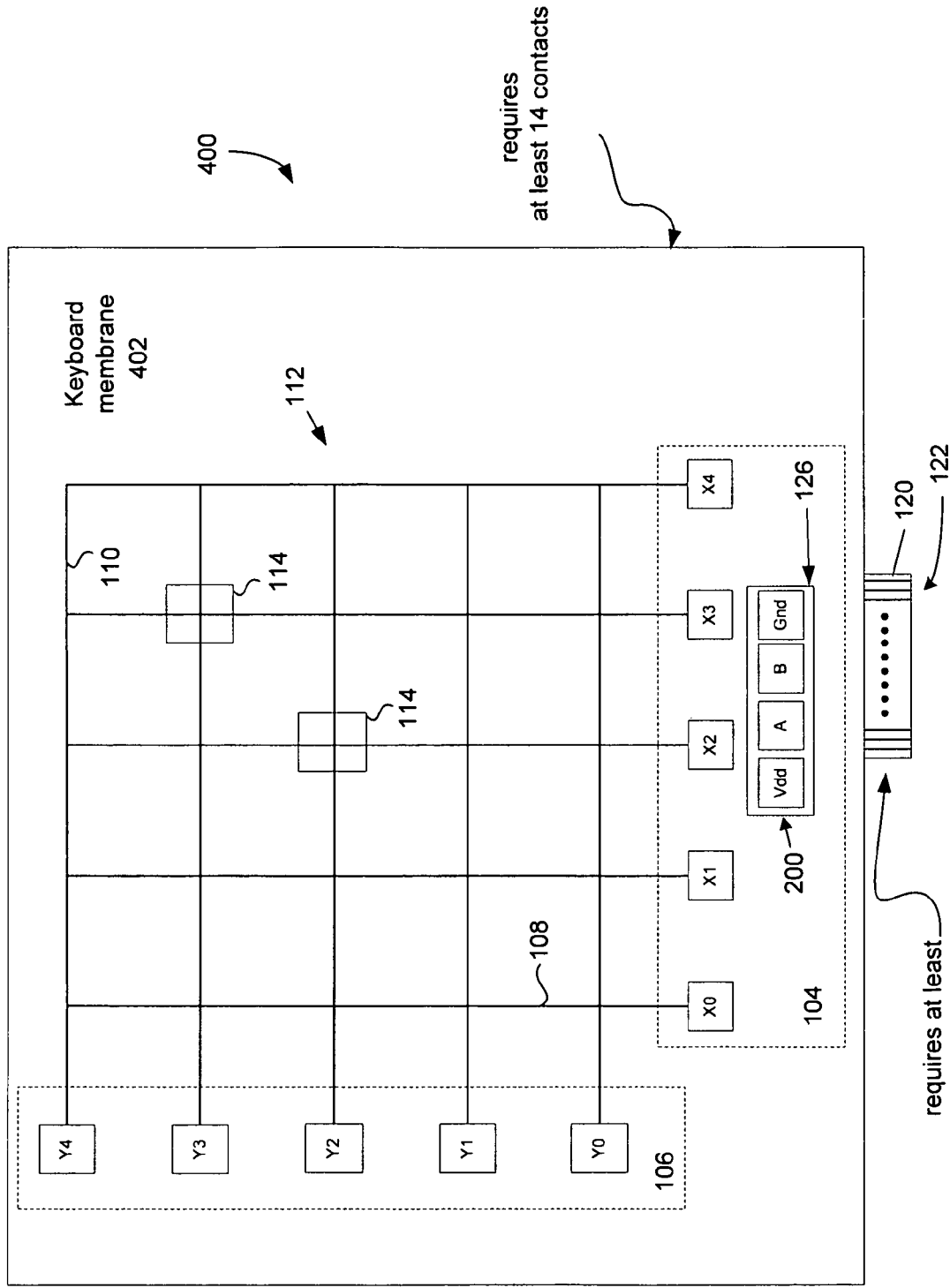
FIG. 4 shows a keyboard configuration similar to that shown in FIG. 1 whereby information is embedded in a keyboard membrane using a discrete binary embedding circuit.

FIG. 4 shows keyboard arrangement 400 similar to that shown in FIG. 1 whereby information is embedded in keyboard membrane 402 using discrete binary embedding circuit 200. As described above, discrete binary embedding circuit 200 requires at least four (4) contact pads (two information contact pads (pad A and pad B), one for ground GND and one for power supply $V_{DD}$) and to embed at most four (4) additional information states. In this way, for a keyboard membrane such as that shown in FIG. 4, at least 14 contact pads are required along with their associated trace lines which must be accommodated by tail 120. Since binary embedding circuit 200 is not used after keyboard initialization is completed, the contact pads A, B are no longer used as are the associated trace lines. Keyboard membrane 402 is essentially only using approximately 84% (12/14) available contact pads after initialization. It should be noted, however, that in a more commonly scaled keyboard/keyboard membrane such as described above having eight rows and thirteen columns with twenty six contact pads, the utilization of available contact pads after initialization is approximately 96% (24/26).

In any case, the size of tail 120 must be such to accommodate all trace lines that are used at any time (both during and after initialization). Even though the apparently modest increase in tail size in order to accommodate even a single contact can have a substantial impact is the cost in material and time in the manufacture of a large number of keyboards forced to use even a marginally larger tail than would otherwise be necessary. Not only is the cost of manufacturing increased, but the ability to add additional functionality to the keyboard is put in jeopardy if that additional functionally would require an additional contact.

Figure 5:
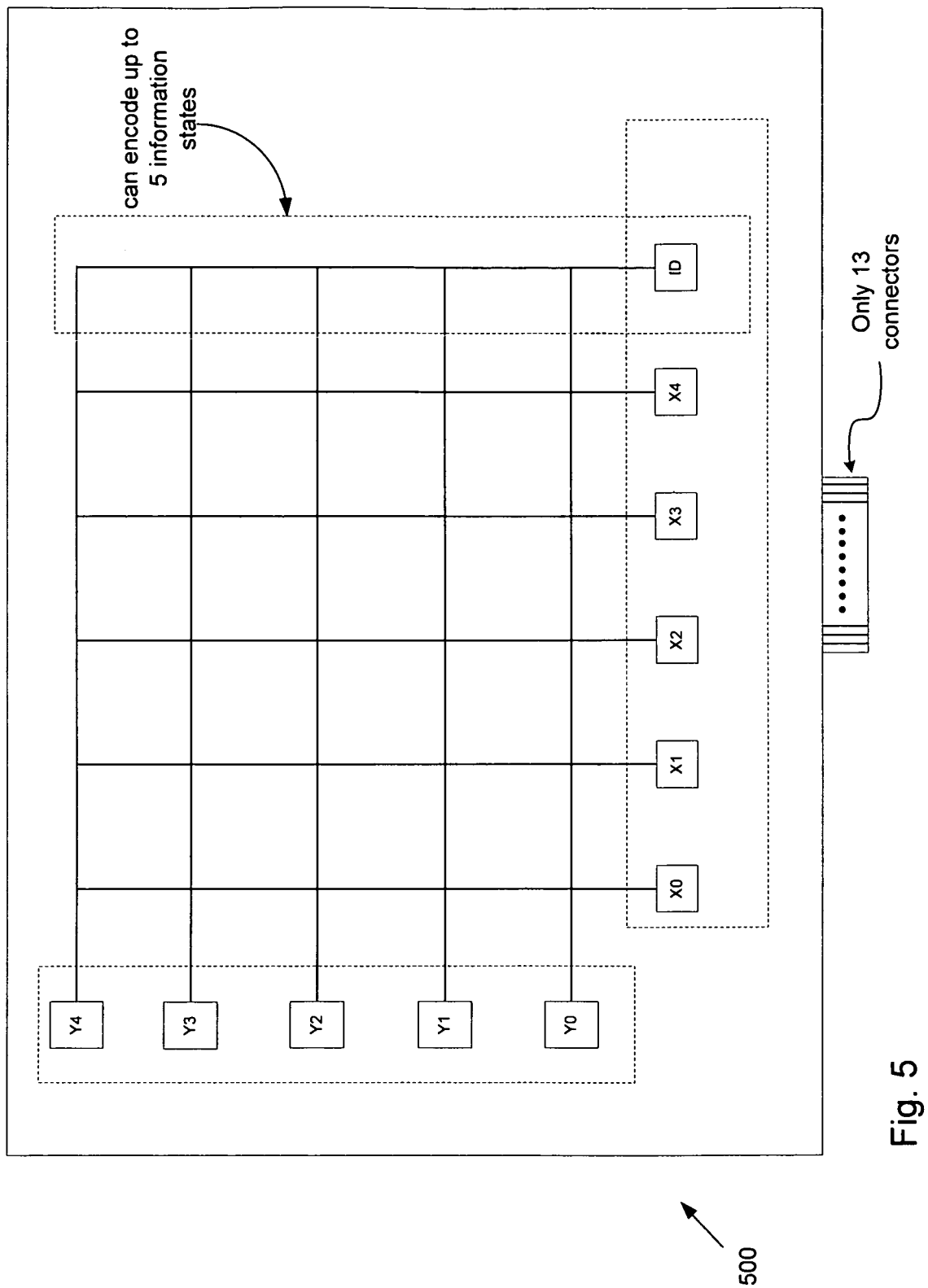
FIG. 5 shows a keyboard configuration similar to that shown in FIG. 1 whereby information is embedded in a keyboard membrane using an integrated information embedding circuit in accordance with the described embodiments.

However, looking at FIG. 5 showing keyboard configuration 500 (reproducing the keyboard configuration of FIG. 3), shows that instead of requiring at least 14 contact pads and contacts as with binary embedding circuit 200, integrating information embedding circuit 304 with switch matrix provides up to 5 additional information states that can be embedded in keyboard membrane 302 using no more than about 13 contact pads. It should be noted, however, that in some embodiments as many as $2^n$ (where n=number of rows in a column type information embedding circuit and the number of columns in a row type embedding circuit) information states can be embedded. This additional information can be embedded by essentially keeping track of the state (asserted or not asserted) and the corresponding identification of the respective contact pads (see FIG. 6 as an example of such a case). Therefore, using integrated information embedding circuit 304 more than doubles (and in some cases, substantially more than doubles) the number of information states that can be embedded in keyboard membrane 302 while necessitating only one additional contact pad as opposed to the at least two required for binary embedding circuit 200. In this way, information embedding circuit 304 provides substantially more potential information states being embedded into keyboard membrane 304 while at the same time reducing the total contact pad count (and associated contacts) by at least one.

Figure 6:
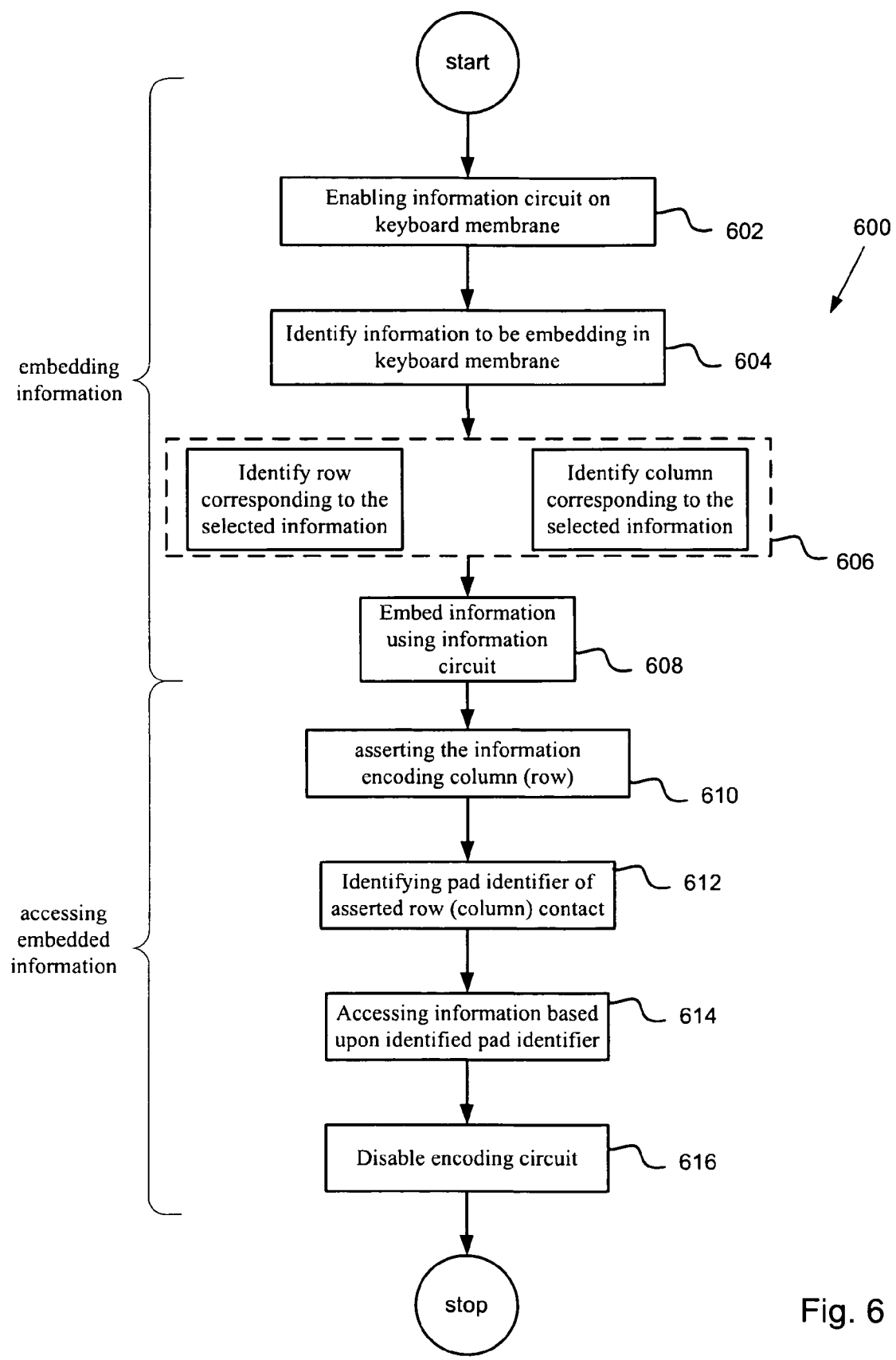
FIG. 6 shows a process for embedding and accessing embedded information in a keyboard membrane in accordance with the described embodiments.

FIG. 6 shows a process 600 for embedding and accessing embedded information in a keyboard membrane in accordance with the described embodiments. The process 600 begins at 602 by selecting information to be embedding in the keyboard membrane. Such information can include, for example, a logic state indicative of a keyboard characteristic such as the nature of a character map to be used to identify a character associated with a particular key location. At 604, an information embedding circuit integrated with a switch matrix on the keyboard membrane is accessed. At 606, in the case of a column type information embedding circuit having an information embedding column, a row corresponding to the selected information is identified (it should be noted that this same procedure is operable for row type information embedding circuits). At 608, the identified information is embedded. In the case of a column type information embedding circuit, the embedding is carried out by permanently connecting the identified row and the information embedding column. In this way an assertion of the embedding column also asserts the identified row. In the described embodiments, the embedding can include, for example, hard wiring together the identified row and the information embedding column. At 610-614, the information embedded in keyboard membrane can be accessed by asserting the information embedding column at 610, reading the asserted row contact pad having a pad identifier at 612, and using the pad identifier to access the embedded information at 614. For example, the embedded information can include a look up table that correlates the pad number of the asserted row with a particular keyboard type, such as JIS, ISO, and ANSI. At 616, the embedding circuitry is disabled.

The various aspects, embodiments, implementations or features of the invention can be used separately or in any combination. The invention is preferably implemented by hardware, software or a combination of hardware and software. The software can also be embodied as computer readable code on a computer readable medium. The computer readable medium is any data storage device that can store data which can thereafter be read by a computer system. Examples of the computer readable medium include read-only memory, random-access memory, CD-ROMs, DVDs, optical data storage devices. The computer readable medium can also be distributed over network-coupled computer systems so that the computer readable code is stored and executed in a distributed fashion.

While this invention has been described in terms of several preferred embodiments, there are alterations, permutations, and equivalents, which fall within the scope of this invention. It is therefore intended that the following appended claims be interpreted as including all such alterations, permutations, and equivalents as fall within the true spirit and scope of the present invention.

What is claimed is:

1. A system for embedding information in a keyboard membrane incorporated in a keyboard, comprising:
    a switch matrix comprising a plurality of column conductors overlaid with a plurality of row conductors;
    an information embedding circuit integrated with the switch matrix, wherein the information is embedded in the keyboard membrane by permanently connecting a selected one of the plurality of row conductors with an information embedding column conductor, wherein the information embedding circuit is used only during an initialization of the keyboard and is disabled after the keyboard initialization is successfully completed, wherein:
    the embedded information is accessed by:
    asserting the information embedding column conductor; and
    causing the selected one of the plurality of row conductors to be asserted based upon the assertion of the information embedding column conductor.

2. The system as recited in claim 1, wherein the embedded information is further accessed by:
    identifying the asserted row conductor; and
    using the identified asserted row conductor to retrieve the embedded information.

3. The system as recited in claim 1, wherein the information embedded in the keyboard membrane is an indication of a keyboard type.

4. A system for embedding information in a keyboard membrane incorporated in a keyboard assembly, comprising:
    a switch matrix comprising a plurality of column conductors overlaid with a plurality of row conductors;
    an information embedding circuit integrated with the switch matrix, wherein the information is embedded in the keyboard membrane by permanently connecting a selected one of the plurality of column conductors with an information embedding row conductor, wherein the information embedding circuit is used only during a boot sequence of the keyboard and is disabled after the keyboard boot sequence is successfully completed; wherein,
    the embedded information is accessed by:
    asserting the information embedding row conductor; and
    causing the selected one of the plurality of column conductors to be asserted based upon the assertion of the information embedding row conductor.

5. The system as recited in claim 4, wherein the embedded information is further accessed by
    identifying the asserted column conductor, and
    using the identified asserted column conductor to retrieve the embedded information.

6. A method for embedding information in a keyboard membrane incorporated in a keyboard assembly, wherein the keyboard membrane includes at least a switch matrix comprising a plurality of column conductors overlaid with a plurality of row conductors and an information embedding circuit integrated with the switch matrix, comprising:

wherein when the information embedding circuit includes an information embedding column conductor, then permanently electrically connecting a selected one of the plurality of row conductors with the information embedding column conductor, wherein when the information embedding column conductor is asserted, the selected one of the plurality of row conductors is also asserted; and wherein when the information embedding circuit includes an information embedding row conductor, then permanently electrically connecting a selected one of the plurality of column conductors with the information embedding row conductor, wherein when the information embedding row conductor is asserted, the selected one of the plurality of column conductors is also asserted;

wherein the information embedding circuit is used only during keyboard assembly initialization and is disabled after keyboard assembly initialization is successfully completed.

7. The method as recited in claim 6, wherein the embedded information is accessed during boot up of the keyboard.

8. The method as recited in claim 7, wherein the embedded information is accessed by, asserting the information embedding column conductor;
asserting the selected one of the row conductors in response to the asserting the information embedding column conductor;
sensing which of the plurality of row conductors is asserted;
identifying the asserted row conductor; and
using the identified row conductor to access the embedded information.

9. The method as recited in claim 8, wherein the embedded information is accessed by, asserting the information embedding row conductor;
asserting the selected one of the column conductors in response to the asserting the information embedding row conductor;
sensing which of the plurality of column conductors is asserted;
identifying the asserted column conductor; and
using the identified column conductor to access the embedded information.

10. A keyboard membrane, comprising:
a switch matrix; and
a non-binary type keyboard information embedding circuit integrated with the switch matrix used for embedding information in the keyboard, wherein the information embedding circuit is used only during a boot sequence of the keyboard and is disabled after the keyboard boot sequence is successfully completed; wherein
the information embedding circuit includes at least one of an information embedding column conductor and an information embedding row conductor;
information is embedded in the keyboard membrane by permanently connecting a selected one of a plurality of different conductors with the at least one of an information embedding column conductor and an information embedding row conductor; and
causing the selected one of the plurality of different conductors to be asserted based upon the assertion of the at least one of an information embedding column conductor and an information embedding row conductor.

11. The keyboard membrane as recited in claim 10, wherein the switch matrix comprises:

an upper resin sheet;
a lower resin sheet;
a plurality of column contact pads each connected to one of a plurality of column conductors formed on an upper portion of the lower resin sheet, and
a plurality of row contact pads each connected to one of a plurality of row conductors formed on a lower portion of the upper resin sheet, wherein the column conductors and row conductors are overlaid one atop the other to form the switch matrix and are electrically isolated from each other.

12. The keyboard membrane as recited in claim 10, wherein the keyboard membrane has a reduced number of contact pads than would otherwise be required with a binary type information embedding circuit.

13. An apparatus for efficiently embedding information on a keyboard membrane, the keyboard membrane having at least a switch matrix formed of n column lines and m row lines each of which has a contact pad such that the switch matrix includes a number N contact pads, where N=m+n, comprising:

a single contact pad; and
a single conductor line electrically connected to the single contact pad, wherein the single conductor line is electrically connected to at least one of the m row lines of the switch matrix, wherein when the single contact pad is asserted, then the contact pad associated with the at least one of the m row lines is determined to also be asserted;
wherein the single contact pad is used only during initialization of the keyboard and is disabled after keyboard initialization is successfully completed.

14. The apparatus as recite in claim 13, wherein the determination of which of the m row lines is asserted comprises: sensing all of the m row lines during a period of time that the single contact pad is asserted.

15. The apparatus as recited in claim 14, wherein the keyboard membrane includes at least N+1 contact pads.

16. The apparatus as recited in claim 15, further comprising: a data capture circuit arranged to capture information relating to the at least one of the m row lines determined to also be asserted.

17. A non-transitory computer readable medium including at least computer program code for accessing information embedded in a keyboard membrane during a keyboard initialization using an information embedding circuit having at least a cross connected first and second conductor lines, the computer readable medium comprising:

computer program code for asserting a contact pad associated with the first conductor line only during keyboard initialization;
computer program code for determining an identity of the second conductor line cross connected with the asserted first conductor line;
computer program code using the identity of the cross connected second conductor line to access the embedded information; and
computer program code for disabling the information embedding circuit after the keyboard initialization is successfully completed.

18. The non-transitory computer readable medium as recited in claim 17, wherein the keyboard membrane includes a switch matrix.

19. The non-transitory computer readable medium as recited in claim 18, wherein the information embedding circuit is integrated with the switch matrix.

20. The non-transitory computer readable medium as recited in claim 18, wherein the embedded information is a list of keyboard types and wherein the identity of the cross connected second conductor line points to one of the list of keyboard types corresponding to the type of keyboard membrane.

* * * * *